United States Patent
Yabuuchi (10) Patent No.: US 11,551,755 B2
(45) Date of Patent: Jan. 10, 2023

(54) SEMICONDUCTOR DEVICE INCLUDING A CONTENT REFERENCE MEMORY

(71) Applicant: RENESAS ELECTRONICS CORPORATION, Tokyo (JP)

(72) Inventor: Makoto Yabuuchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/318,632

(22) Filed: May 12, 2021

(65) Prior Publication Data

US 2021/0375362 A1 Dec. 2, 2021

(30) Foreign Application Priority Data

Jun. 1, 2020 (JP) .............................. JP2020-095806

(51) Int. Cl.
G11C 15/00 (2006.01)
G11C 15/04 (2006.01)
G11C 8/08 (2006.01)
G11C 7/12 (2006.01)
G11C 7/06 (2006.01)

(52) U.S. Cl.
CPC .............. *G11C 15/04* (2013.01); *G11C 7/065* (2013.01); *G11C 7/12* (2013.01); *G11C 8/08* (2013.01)

(58) Field of Classification Search
CPC ....................................................... G11C 15/04
USPC .......................................................... 365/49
See application file for complete search history.

(56) References Cited

U.S. PATENT DOCUMENTS

| 10,629,264 | B2 | 4/2020 | Sawada et al. | |
| 2008/0259667 | A1* | 10/2008 | Wickeraad | G11C 15/04 365/49.1 |
| 2011/0026288 | A1* | 2/2011 | Watanabe | G11C 15/04 365/49.17 |
| 2018/0350438 | A1* | 12/2018 | Yabuuchi | G11C 16/12 |

FOREIGN PATENT DOCUMENTS

JP 2018-206451 A 12/2018

* cited by examiner

*Primary Examiner* — Hoai V Ho
(74) *Attorney, Agent, or Firm* — McDermott Will & Emery LLP (57) ABSTRACT

A semiconductor device includes a plurality of memory cells connected to a match line; a word line driver connected to a word line; a valid cell configured to store a valid bit indicating valid or invalid of an entry; a first precharge circuit connected to one end of the match line and configured to precharge the match line to a high level; and a second precharge circuit connected to the other end of the match line and configured to precharge the match line to a high level. The plurality of memory cells are arranged between the first precharge circuit and the second precharge circuit, and the second precharge circuit is arranged between the word line driver and the plurality of memory cells.

6 Claims, 11 Drawing Sheets

| SRAM CELL (X CELL) | SRAM CELL (Y CELL) | TCAM CELL DATA |
|---|---|---|
| "1" | "0" | "0" |
| "0" | "1" | "1" |
| "0" | "0" | "X" (don't care) |
| "1" | "1" | NOT USED |

SEMICONDUCTOR DEVICE INCLUDING A CONTENT REFERENCE MEMORY

CROSS-REFERENCE TO RELATED APPLICATIONS

The disclosure of Japanese Patent Application No. 2020-095806 filed on Jun. 1, 2020 including the specification, drawings and abstract is incorporated herein by reference in its entirety.

BACKGROUND

This disclosure relates to a semiconductor device and is applicable to, for example, a semiconductor device including a content reference memory.

A storage device referred to as a content addressable memory or CAM as a search memory is configured to search a data word matching with a search word from among stored data words and output an address thereof when the matched data word is found. Here, the data word is referred to also as an entry and the search word is referred to also as search data.

There are BCAM (Binary CAM) and TCAM (Ternary CAM) as the CAM. Each memory cell of the BCAM stores information of "0" or "1". On the other hand, in the case of the TCAM, each memory cell can store information of "x (Don't Care)" in addition to "0" and "1". Note that "x" indicates that it can be either "0" or "1".

The CAM has a match line (ML) for comparing the information stored in the memory cell and the data that a user wants to search and showing whether both data match or mismatch. Then, address information (Hit Index) corresponding to the matched match line is output. Also, some CAMs store valid information indicating whether or not the entry content of the CAM is valid.

There are disclosed techniques listed below. [Patent Document 1] Japanese Unexamined Patent Application Publication No. 2018-206451

SUMMARY

It is very important in the CAM to increase the search access speed. A plurality of memory cells constituting one entry are connected to the match line which is the critical path of the search access. Therefore, as the wiring length of the match line becomes long, the load capacity of the match line becomes large, and it is difficult to increase the search access speed.

In an aspect of this disclosure, precharge circuits of the match line are arranged on both sides of the CAM cell array and valid information is supplied to these precharge circuits.

By the semiconductor device mentioned above, it is possible to improve the search access speed.

DETAILED DESCRIPTION

Hereinafter, an embodiment, modifications, and an application example will be described with reference to the drawings. In the following description, the same components are denoted by the same reference characters and the repetitive description thereof will be omitted. Note that the drawings will be represented schematically in terms of width, thickness, shape, and others of each components as compared to actual aspects in order to make the description clearer, but the drawings are mere examples and do not limit the interpretation of this disclosure. In the embodiment, the TCAM will be described as an example, but this disclosure is not limited to this and is applicable to a search memory using a match line.

Embodiment

Figure 1:
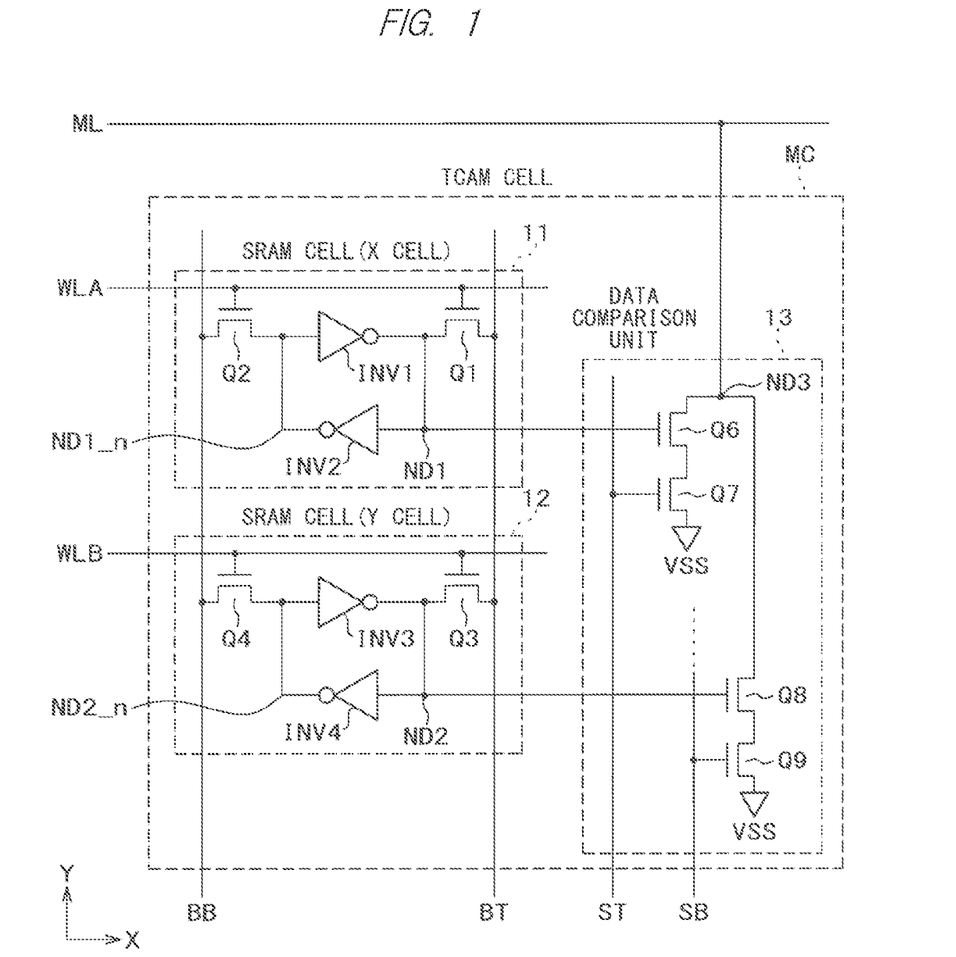
FIG. 1 is a circuit diagram showing an example of a configuration of a TCAM cell in the embodiment.
Figure 2:
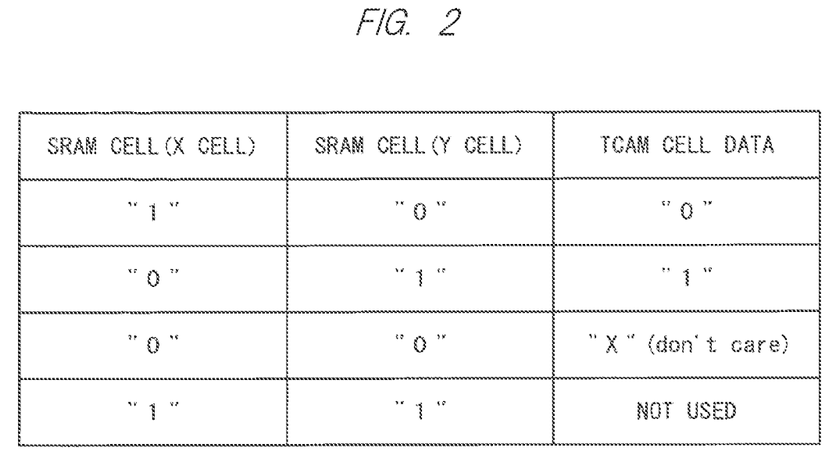
FIG. 2 is a diagram showing the correspondence relationship between stored contents of an X cell and a Y cell and data of the TCAM cell shown in FIG. 1 in the form of table.

A configuration of a TCAM cell will be described with reference to FIG. 1 and FIG. 2. FIG. 1 is a circuit diagram showing an example of a configuration of a TCAM cell in the embodiment. FIG. 2 is a diagram showing the correspondence relationship between stored contents of an X cell and a Y cell and data of the TCAM cell shown in FIG. 1 in the form of table.

As shown in FIG. 1, a TCAM cell MC as a memory cell includes an X cell 11, a Y cell 12, and a data comparison unit 13. The X cell 11 and the Y cell 12 are composed of SRAM (Static Random Access Memory), and are referred to also as SRAM cells. The X cell 11 stores mutually complementary 1-bit data in the internal storage nodes ND1 and ND1_$n$. Here, being complementary means a relationship in which when one is "1", the other is "0". The Y cell 12 stores mutually complementary 1-bit data in the internal storage nodes ND2 and ND2_$n$.

The TCAM cell MC is connected to a bit line pair BT and BB, a search line pair ST and SB, a match line ML, a first word line WLA, and a second word line WLB.

The X cell 11 includes inverters INV1 and INV2 and N-channel MOS (Metal Oxide Semiconductor) transistors Q1 and Q2. The inverter INV1 is connected between the storage node ND1 and the storage node ND1_$n$ such that the direction from the storage node ND1_$n$ to the storage node ND1 is the forward direction. The inverter INV2 is connected in parallel and in the opposite direction to the inverter INV1. The N-channel MOS transistor Q1 is connected between the storage node ND1 and the bit line BT. The N-channel MOS transistor Q2 is connected between the storage node ND1_n and the bit line BB. The gates of the N-channel MOS transistors Q1 and Q2 are connected to the first word line WLA.

The Y cell 12 includes inverters INV3 and INV4 and N-channel MOS transistors Q3 and Q4. The inverter INV3 is connected between the storage node ND2 and the storage node ND2_n such that the direction from the storage node ND2_n to the storage node ND2 is the forward direction. The inverter INV4 is connected in parallel and in the opposite direction to the inverter INV3. The N-channel MOS transistor Q3 is connected between the storage node ND2 and the bit line BT. The N-channel MOS transistor Q4 is connected between the storage node ND2_n and the bit line BB. The gates of the N-channel MOS transistors Q3 and Q4 are connected to the second word line WLB.

The data comparison unit 13 includes N-channel MOS transistors Q6 to Q9. The N-channel MOS transistors Q6 and Q7 are connected in series between a node ND3, which is a connection point with the match line ML, and a ground potential VSS. The N-channel MOS transistors Q8 and Q9 are connected in series between the node ND3 and the ground potential VSS, and in parallel to the entire N-channel MOS transistors Q6 and Q7 connected in series. The gates of the N-channel MOS transistors Q6 and Q8 are connected to the storage nodes ND1 and ND2, respectively. The gates of the N-channel MOS transistors Q7 and Q9 are connected to the search line pair ST and SB, respectively.

Each of the inverters INV1, INV2, INV3, and INV4 has a P-channel MOS transistor and an N-channel MOS transistor. A source-drain path of the P-channel MOS transistor and a source-drain path of the N-channel MOS transistor are connected in series between a power supply potential VDD as the first potential and the ground potential VSS as the second potential. The gate of the P-channel MOS transistor and the gate of the N-channel MOS transistor are commonly connected to serve as an input terminal of the inverter. The drain of the P-channel MOS transistor and the drain of the N-channel MOS transistor are commonly connected to serve as an input terminal of the inverter.

Note that a memory cell of a BCAM can be configured by, for example, removing the second word line WLB and the Y cell 12 and connecting the gate electrode of the N-channel MOS transistor Q8 to the storage node ND1_n of the X cell 11 in FIG. 1.

As shown in FIG. 1 and FIG. 2, the TCAM cell MC can store three values of "0", "1", and "x" by using a 2-bit SRAM cell. Specifically, it is assumed that when "1" is stored in the storage node ND1 of the X cell 11 and "0" is stored in the storage node ND2 of the Y cell 12, "0" is stored in the TCAM cell MC. It is assumed that when "0" is stored in the storage node ND1 of the X cell 11 and "1" is stored in the storage node ND2 of the Y cell 12, "1" is stored in the TCAM cell MC. It is assumed that when "0" is stored in the storage node ND1 of the X cell 11 and "0" is stored in the storage node ND2 of the Y cell 12, "x" is stored in the TCAM cell MC. When "1" is stored in the storage node ND1 of the X cell 11 and "1" is stored in the storage node ND2 of the Y cell 12, it is not used.

According to the configuration of the TCAM cell MC described above, when the search data is "1" and the TCAM data is "0", the MOS transistors Q6 and Q7 are in the ON state, and thus the potential of the precharged match line ML is pulled out to the ground potential VSS. Here, when the search line ST is "1" and the search line SB is "0", the search data is set to "1". When the storage node ND1 is "1" and the storage node ND2 is "0", the TCAM data is set to "0".

When the search data is "0" and the TCAM data is "1", the MOS transistors Q8 and Q9 are in the ON state, and thus the potential of the precharged match line ML is pulled out to the ground potential VSS. Here, when the search line ST is "0" and the search line SB is "1", the search data is set to "0". When the storage node ND1 is "0" and the storage node ND2 is "1", the TCAM data is set to "1".

Namely, when the search data and the TCAM data mismatch, the potential of the match line ML is pulled out to the ground potential VSS.

On the contrary, when the input search data is "1" and the TCAM data is "1" or "x", the potential of the precharged match line ML is maintained. When the input search data is "0" and the TCAM data is "0" or "x", the potential of the precharged match line ML is maintained. Namely, when the search data and the TCAM data match, the potential of the precharged match line ML is maintained. Here, the potential of the precharged match line ML is at the level of the power supply potential VDD.

As described above, in the TCAM, the charge stored in the match line ML is pulled out unless the data of all TCAM cells MC connected to the match line ML corresponding to one entry (memory cell row) match with the input search data.

Figure 3:
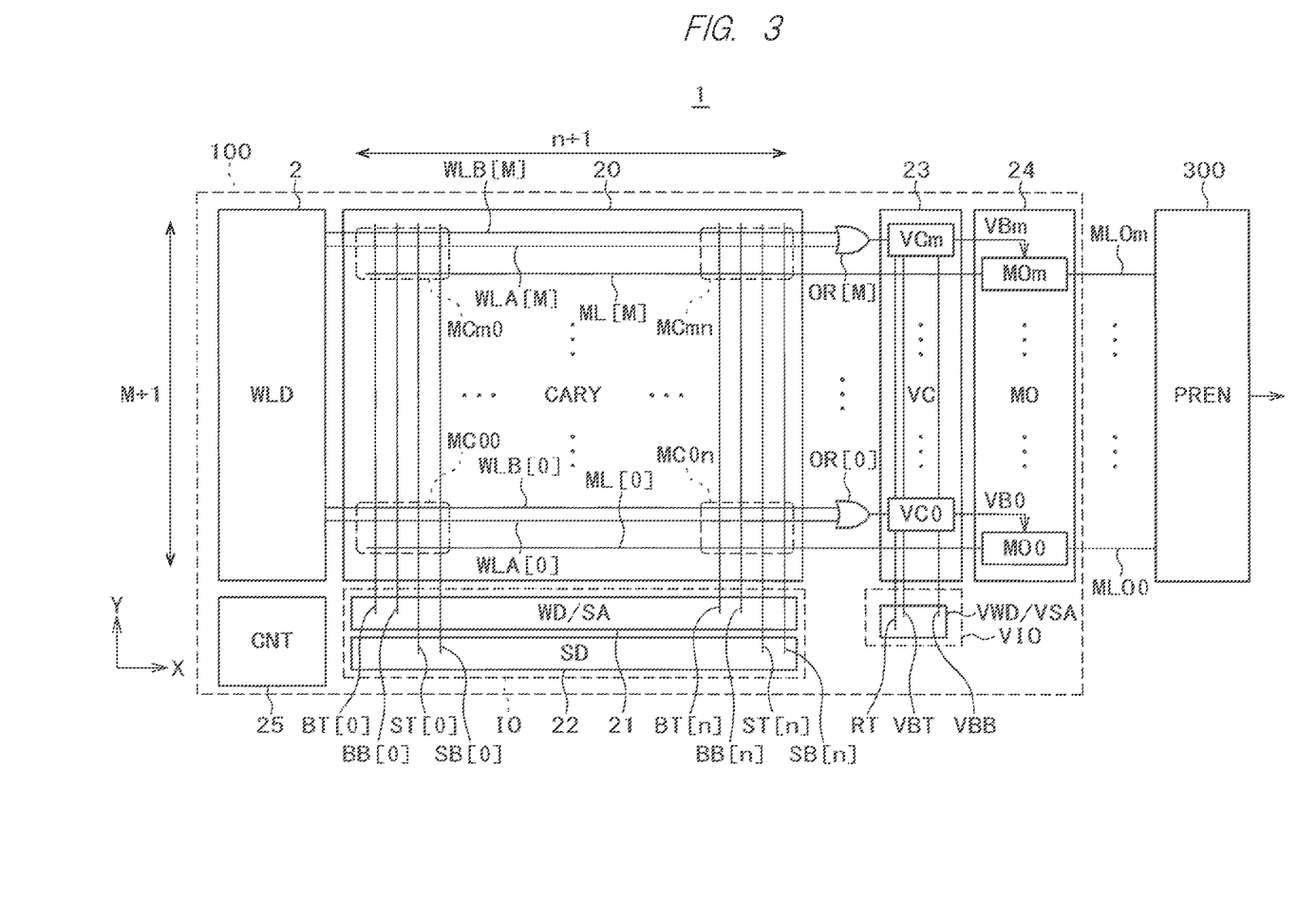
FIG. 3 is a block diagram showing a configuration of a TCAM device in the embodiment.

The array configuration will be described with reference to FIG. 3. FIG. 3 is a block diagram showing a configuration of a TCAM device in the embodiment.

A TCAM device 1 includes a TCAM macrocell 100 and a priority encoder (PREN) 300. The TCAM macrocell 100 includes a TCAM cell array (CARY) 20, a valid bit unit 23, a match line output circuit unit (MO) 24, and a word line driver (WLD) 2. Here, the word line driver (WLD) 2 is a circuit unit that drives the first word line WLA and the second word line WLB shown in FIG. 1.

The TCAM macrocell 100 further includes an input/output circuit unit IO, an input/output circuit unit VIO, and a control logic circuit (CNT) 25. The input/output circuit unit IO includes a write driver and read sense amplifier (WD/SA) 21 and a search line driver (SD) 22. The input/output circuit unit VIO includes a write driver and read sense amplifier (VWD/VSA) for the valid bit unit 23.

The TCAM cell array 20 includes a plurality of TCAM cells MC arranged in a matrix. The bit line pair BT and BB extends in the column direction of the TCAM cell array 20 and is shared by a plurality of TCAM cells MC arranged in the column direction. The search line pair ST and SB extends in the column direction of the TCAM cell array 20 and is shared by a plurality of TCAM cells MC arranged in the column direction. The match line ML extends in the row direction of the TCAM cell array 20 and is shared by a plurality of TCAM cells MC arranged in the row direction. The first word line WLA and the second word line WLB extend in the row direction of the TCAM cell array 20 and are shared by a plurality of TCAM cells MC arranged in the row direction. Here, the row direction of the TCAM cell array 20 is the X direction, and the column direction thereof is the Y direction.

FIG. 3 shows the case where the number of rows (number of entries) of the TCAM cell array 20 is M+1 (M is a positive integer) and the number of columns (number of bits of entries) is n+1 (n is a positive integer). For each column of the TCAM cell array 20, n+1 bit line pairs (BT[0] and BB[0] to BT[n] and BB[n]) and n+1 search line pairs (ST[0] and SB[0] to ST[n] and SB[n]) are provided. For each row of the TCAM cell array 20, M+1 match lines (ML[0] to ML[M]), M+1 first word lines for X cell 11 (WLA[0] to WLA[M]]), and M+1 second word lines for Y cell 12 (WLB[0] to WLB[M]) are provided.

The write driver and read sense amplifier 21 includes the write driver WD and the read sense amplifier SA. The write driver WD supplies write data to each TCAM cell MC through the bit line pair BT and BB at the time of writing. The read sense amplifier SA amplifies data read from each TCAM cell MC through the bit line pair BT and BB and output the amplified data at the time of reading.

The search line driver 22 supplies search data to each TCAM cell MC through the search line pairs (ST[0] and SB[0] to ST[n] and SB[n]) at the time of searching.

The control logic circuit 25 controls the operation of the entire TCAM macrocell 100. For example, the control logic circuit 25 controls the operation of the search line driver 22 by receiving a search command and outputting a control signal to the search line driver 22 at the time of searching. The control logic circuit 25 controls the operation of the write driver WD and the word line driver 2 by outputting a control signal to the write driver WD and the word line driver 2 at the time of writing. Further, the control logic circuit 25 controls the operation of the word line driver 2 and the read sense amplifier SA by outputting a control signal to the word line driver 2 and the read sense amplifier SA at the time of reading.

The valid bit unit 23 includes a plurality of valid cells (VC0 to VCm). Each of the plurality of valid cells (VC0 to VCm) is connected to a bit line pair VBT and VBB. Each of the pair of bit lines VBT and VBB is connected to the input/output circuit unit VIO. A third word line of each of the plurality of valid cells (VC0 to VCm) is connected to the first word line (WLA[0] to WLA[M]) and the second word line (WLB[0] to WLB[M] of the corresponding entry via an OR circuit (OR[0] to OR[M]). Further, each of the plurality of valid cells (VC0 to VCm) stores a valid bit (VB0 to VBm) as information indicating whether the corresponding entry is valid or invalid. The plurality of valid cells (VC0 to VCm) are also connected to a wiring RT to which the reset signal is supplied. By activating the reset signal, it is possible to collectively set the valid bits (VB0 to VBm) stored in the plurality of valid cells (VC0 to VCm) to the data indicating invalid. Here, the reset signal is activated by, for example, setting it to a high level. Further, for example, the valid bit (VB0 to VBm) indicates invalid when it is at a low level.

When either the first word line (WLA[0] to WLA[M]) or the second word line (WLB[0] to WLB[M]) of the corresponding entry is brought into a selected state, the output of the corresponding OR circuit (OR[0] to OR[M]) is brought into a selected state, so that the plurality of valid cells (VC0 to VCm) are brought into a selected state. Namely, the OR circuit (OR[0] to OR[M]) is a selection circuit which is connected to the first word line (WLA[0] to WLA[M]) and the second word line (WLB[0] to WLB[M]) and is configured to bring the plurality of valid cells (VC0 to VCm) into a selected state in accordance with the selected state of the first word line (WLA[0] to WLA[M]) or the second word line (WLB[0] to WLB[M]). Consequently, the valid bit (VB0 to VBm) is written to the valid cell (VC0 to VCm) in a selected state through the pair of bit lines VBT and VBB.

The match line output circuit unit 24 has a plurality of match line output circuits (MO0 to MOm) corresponding to each row of the TCAM cell array 20. Each input of the match line output circuit (MO0 to MOm) is connected to the corresponding match line (ML[0] to ML[M]), and each output of the match line output circuit (MO0 to MOm) is connected to the corresponding match signal output line (MLO0 to MLOm). Each match line output circuit (MO0 to MOm) receives a valid bit (VB0 to VBm) from the corresponding valid cell (VC0 to VCm). The operation of the match line output circuit (MO0 to MOm) is controlled by the value of the valid bit (VB0 to VBm).

The match line output circuit (MO0 to MOm) generates a detection signal indicating whether the corresponding TCAM cell data and the input search data match or mismatch based on the potential of the corresponding match line (ML[0] to ML[M]) and outputs the signal to the corresponding match signal output line (MLO0 to MLOm) at the time of searching. When the valid bit (VB0 to VBm) indicates valid, the signal level of the match signal output line (MLO0 to MLOm) is set to the level of the detection signal indicating whether the corresponding TCAM cell data and the input search data match or mismatch. On the other hand, when the valid bit (VB0 to VBm) indicates invalid, the signal level of the match signal output line (MLO0 to MLOm) is set to, for example, the signal level indicating mismatch regardless of the detection signal indicating whether the corresponding TCAM cell data and the corresponding part of input search data match or not. Here, for example, the signal level of the match signal output line (MLO0 to MLOm) is set to a high level in the case of match and to a low level in the case of mismatch.

The priority encoder (PREN) 300 is provided in order to select one match signal output line according to a predetermined priority order when some of the plurality of match signal output lines (MLO0 to MLOm) are set to the signal level indicating match at the time of searching.

Figure 4:
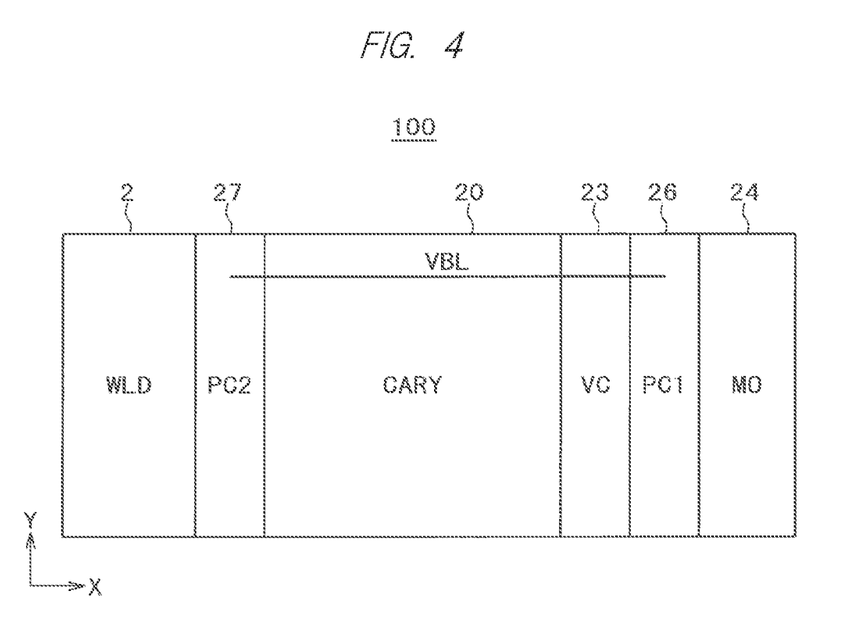
FIG. 4 is a layout diagram showing a cell arrangement of a TCAM macrocell shown in FIG. 3.

The cell arrangement of the TCAM macrocell 100 will be described with reference to FIG. 4. FIG. 4 is a layout diagram showing the arrangement of a part of the cells of the TCAM macrocell of FIG. 3.

Figure 5:
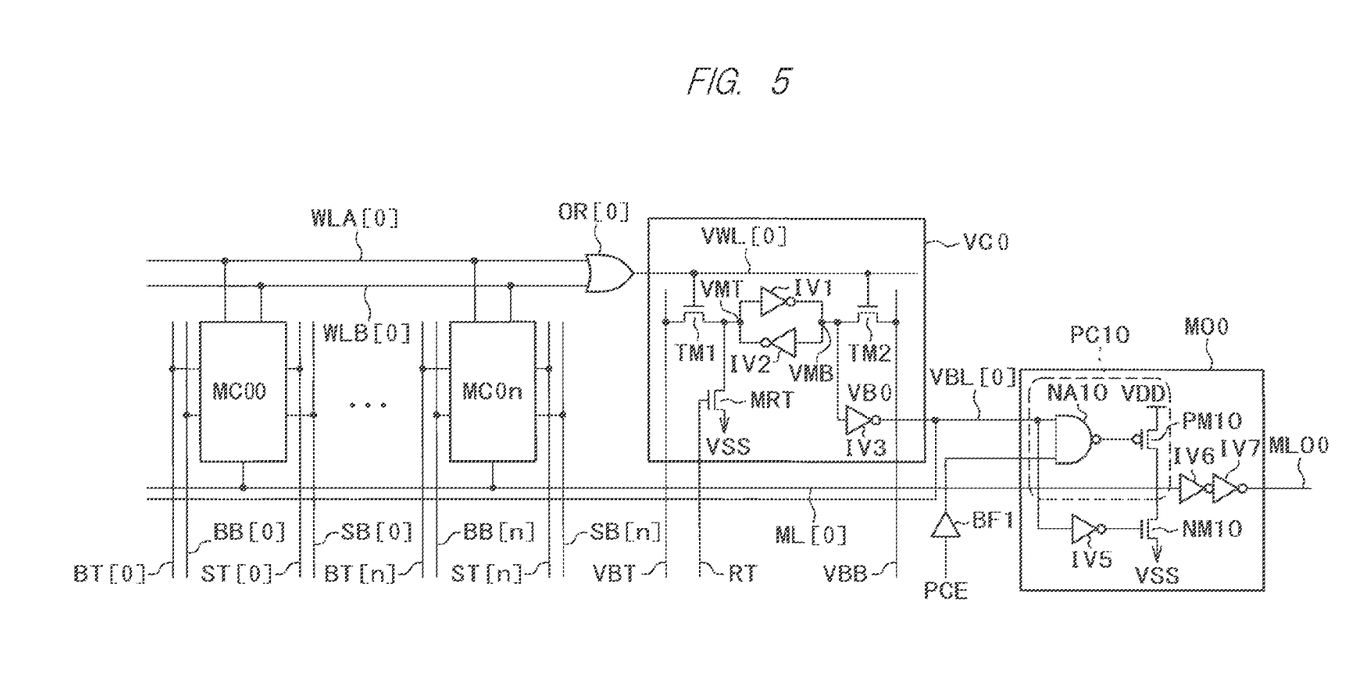
FIG. 5 is a diagram showing an example of a circuit configuration corresponding to one entry of the TCAM macrocell shown in FIG. 3.

The TCAM macrocell 100 is configured by arranging each cell of the word line driver (WLD) 2, a second precharge circuit unit (PC2) 27, the TCAM cell array (CARY) 20, the valid bit unit (VC) 23, a first precharge circuit unit (PC1) 26, and the match line output circuit unit (MO) 24 in this order in the X direction. Namely, the first precharge circuit unit 26 and the second precharge circuit unit 27 are arranged on both sides of the TCAM cell array 20. The valid bit VB is supplied from the valid bit unit 23 to the first precharge circuit unit 26 and the second precharge circuit unit 27 arranged on both sides of the TCAM cell array 20 through the wiring connection by a valid bit line VBL. Here, as shown in FIG. 5, the valid bit line VBL is arranged in parallel to the match signal output line. In FIG. 3, the illustration of the second precharge circuit unit 27 is omitted. Also, the first precharge circuit unit 26 is illustrated as being included in the match line output circuit unit 24.

An example of the circuit configuration of the TCAM macrocell 100 will be described with reference to FIG. 5. FIG. 5 is a diagram showing an example of a circuit configuration corresponding to one entry of the TCAM macrocell shown in FIG. 3.

The TCAM cell (MC00 to MC0*n*) is connected to the first word line WLA[0], the second word line WLB[0], and the match line ML[0]. Each TCAM cell (MC00 to MC0*n*) is connected to the corresponding bit line pair (BT[0] and BB[0] to BT[n] and BB[n]) and the corresponding search line pair (ST[0] and SB[0] to ST[n] and SB[n]), respectively.

The valid cell VC0 includes a third word line VWL[0] and the bit line pair VBT and VBB. The valid cell VC0 includes the inverters IV1 and IV2, transfer MOS transistors (access transistors) TM1 and TM2, an inverter IV3, and a reset MOS transistor MRT. Here, the transfer MOS transistors TM1 and TM2 and the reset MOS transistor MRT are composed of N-channel MOS transistors. The inverter IV1 is connected between a storage node VMT and a storage node VMB such that the direction from the storage node VMT to the storage node VMB is the forward direction. The inverter IV2 is connected in parallel and in the opposite direction to the inverter IV1. The source-drain path of the transfer MOS transistor TM1 is connected between the storage node VMT and the bit line VBT. The source-drain path of the transfer MOS transistor TM2 is connected between the storage node VMB and the bit line VBB. The gates of the transfer MOS transistors TM1 and TM2 are connected to the third word line VWL[0]. The drain of the reset MOS transistor MRT is further connected to the storage node VMT. The source of the reset MOS transistor MRT is connected to the ground potential VSS. The gate of the reset MOS transistor MRT is connected to the wiring RT to which the reset signal is supplied.

Note that each of the inverters IV1 and IV2 has a P-channel MOS transistor and an N-channel MOS transistor. A source-drain path of the P-channel MOS transistor and a source-drain path of the N-channel MOS transistor are connected in series between the power supply potential VDD and the ground potential VSS. The gate of the P-channel MOS transistor and the gate of the N-channel MOS transistor are commonly connected to serve as an input terminal of the inverter. The drain of the P-channel MOS transistor and the drain of the N-channel MOS transistor are commonly connected to serve as an input terminal of the inverter.

The third word line VWL[0] is connected to the output of the OR circuit OR[0]. The input of the OR circuit OR[0] is connected to the first word line WLA[0] and the second word line WLB[0]. Namely, the OR circuit OR[0] can be regarded as a selection circuit which is connected to the first word line WLA[0] and the second word line WLB[0] and is configured to bring the third word line VWL[0] into a selected state in accordance with the selected state of the first word line WLA[0] or the second word line WLB[0].

The value of the storage node VMB of the valid cell VC0 is supplied to the match line output circuit MO0 as the valid bit VB0 via the inverter IV3. The inverter IV3 can be regarded as an output circuit of the storage node VMB.

The match line output circuit MO0 includes a NAND circuit NA10, a P-channel MOS transistor PM10, an N-channel MOS transistor NM10, and inverters IV5, IV6, and IV7. Here, the NAND circuit NA10 and the P-channel MOS transistor PM10 constitute a first precharge circuit PC10.

The first input of the NAND circuit NA10 is connected to the output of the inverter IV3 through the valid bit line VBL[0] and receives the valid bit VB0. The second input of the NAND circuit NA10 receives the non-inverting signal of a precharge control signal PCE via the buffer circuit BF1. The output of the NAND circuit NA10 is connected to the gate of the P-channel MOS transistor PM10. The gate of the N-channel MOS transistor NM10 receives the inverted signal of the valid bit VB0 via the inverter IV5. This N-channel MOS transistor NM10 is provided for preventing an operational problem of becoming a floating node due to that the match line ML[0] is not precharged during the precharge period, when the valid bit VB0 is at a low level.

The source-drain path of the P-channel MOS transistor PM10 and the source-drain path of the N-channel MOS transistor NM10 are connected between the power supply potential VDD and the ground potential VSS. The match line ML[0] is connected to the drains of the P-channel MOS transistor PM10 and the N-channel MOS transistor NM10. The drains of the P-channel MOS transistor PM10 and the N-channel MOS transistor NM10 are also connected to the match signal output line MLO0 via the inverters IV6 and IV7.

Figure 6:
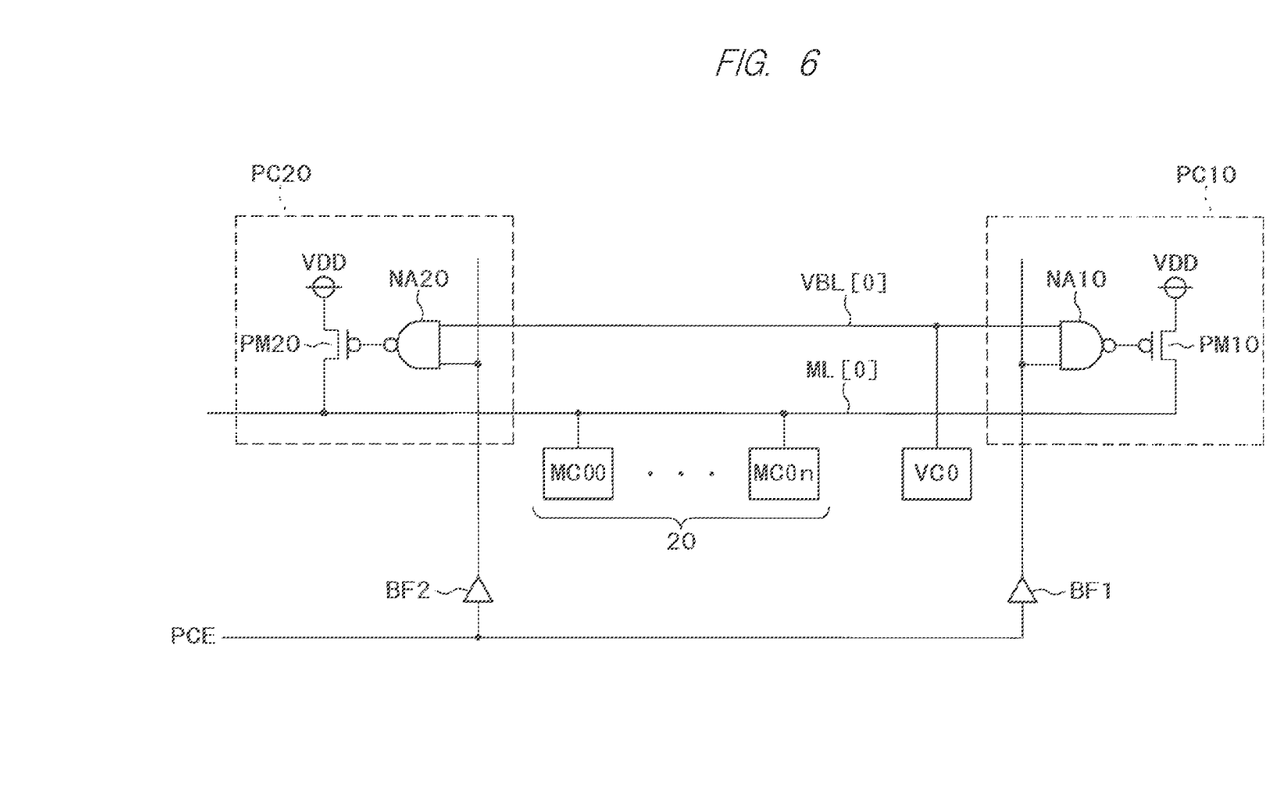
FIG. 6 is a diagram showing an example of a circuit configuration of a precharge circuit corresponding to one entry of the TCAM macrocell shown in FIG. 3.

A configuration example of the precharge circuit will be described with reference to FIG. 6. FIG. 6 is a diagram showing an example of a circuit configuration of the precharge circuit corresponding to one entry of the TCAM macrocell shown in FIG. 3.

The valid bit VB0 is connected from the valid cell VC0 to the first precharge circuit PC10 and the second precharge circuit PC20 arranged on both sides of the TCAM cell array 20 by the valid bit line VBL[0] as wiring. The configuration of the first precharge circuit PC10 is as described above.

The second precharge circuit PC20 of the second precharge circuit unit 27 includes a NAND circuit NA20 and a P-channel MOS transistor PM20. The first input of the NAND circuit NA20 is connected to the output of the inverter IV3 of the valid cell VC0 through the valid bit line VBL[0] and receives the valid bit VB0. The second input of the NAND circuit NA20 receives the non-inverting signal of the precharge control signal PCE via the buffer circuit BF2. The output of the NAND circuit NA20 is connected to the gate of the P-channel MOS transistor PM20. The source-drain path of the P-channel MOS transistor PM20 is connected between the power supply potential VDD and the match line ML[0].

The second precharge circuit PC20 is arranged on the match line ML[0] in the vicinity of the word line driver 2. The first precharge circuit PC10 is arranged on the match line ML[0] in the vicinity of the match line output circuit MO0. Therefore, the match line ML[0] is precharged from both sides by the first precharge circuit PC10 and the second precharge circuit PC20.

Namely, the second precharge circuit PC20 is connected to one end of the match line ML[0] on side closer to the word line driver 2, and precharges the match line ML[0] to the precharge potential from one end side of the match line ML[0]. On the other hand, the first precharge circuit PC10 is connected to the other end of the match line ML[0] on the side closer to the match line output circuit unit 24, and precharges the match line ML[0] to the precharge potential from the other end side of the match line ML[0]. Here, the precharge potential is the power supply potential VDD as a high level. Namely, the direction in which the precharge current by the first precharge circuit PC10 flows and the direction in which the precharge current by the second precharge circuit PC20 flows are opposite to each other.

In the wiring electromigration (EM), if the current is not made to flow continuously from only one direction but made to flow also from the opposite direction, the moved metal returns to its original position and the EM resistance is improved. If the TCAM memory cell MC that drives the match line ML is located away from the precharge circuit, the current path will be unidirectional. However, by connecting the first precharge circuit PC10 and the second precharge circuit PC20 to both ends of the match line ML, the current path becomes bidirectional, so that the EM resistance of the TCAM macrocell is improved.

Next, the writing operation will be described with reference to FIG. 5.

When writing the entry data to the TCAM cells MC00 to MC0n, the first word line WLA[0] or the second word line WLB[0] is brought into the selected state, and the writing is performed by supplying the writing data to the bit line pairs BT[0] and BB[0] to BT[n] and BB[n]. At this time, since the third word line VWL[0] of the valid cell VC0 is also brought into the selected state by the OR circuit OR[0], it is possible to write the valid bit to the valid cell VC0 by supplying the write data to the valid cell VC0 through the bit line pair VBT and VBB. The valid cell VC0 indicates that the entry is valid when the storage node VMT is at a high level and the storage node VMB is at a low level, that is, when the valid bit VB0 is at a high level. On the other hand, the valid cell VC0 indicates that the entry is invalid when the storage node VMT is at a low level and the storage node VMB is at a high level, that is, when the valid bit VB0 is at a low level.

The search operation will be described with reference to FIG. 5 and FIG. 6.

The comparing operation between the entry data stored in the TCAM cell (MC00 to MC0n) and the search data is performed by supplying the search data to the search line pair (ST[0] and SB[0] to ST[n] and SB[n]).

When the valid bit VB0 is at a high level and the precharge control signal PCE is brought into the standby state (low level), the P-channel MOS transistors PM10 and PM20 are in the ON state, and the N-channel MOS transistor NM0 is in the OFF state. Therefore, the match line ML[0] is precharged to a high level.

When the valid bit VB0 is at a high level and the precharge control signal PCE is brought into the active state (high level), the P-channel MOS transistors PM10 and PM20 are in the OFF state, and the N-channel MOS transistor NM0 is in the OFF state. Therefore, the match line ML[0] is brought into a floating state. In this state, when the entry data and the search data match, the precharge potential of the match line ML[0] is maintained at a high level. As a result, the match signal output line MLO0 is brought into a high level indicating the match. On the other hand, when the entry data and the search data mismatch, the precharge potential of the match line ML[0] changes to a low level. As a result, the match signal output line MLO0 is brought into a low level indicating the mismatch.

On the other hand, when the valid bit VB0 is at a low level, the P-channel MOS transistors PM10 and PM20 are in the OFF state, and the N-channel MOS transistor NM0 is in the ON state. Therefore, the potential of the match line ML[0] is brought into a low level, and the match signal output line MLO0 is also brought into a low level indicating the mismatch.

When resetting the stored contents of the valid cell VC0, the reset signal supplied to the wiring RT is brought into a high level. As a result, since the reset MOS transistor MRT is brought into an ON state, the storage node VMT is brought into a low level and the storage node VMB is brought into a high level, so that the data indicating invalid is stored in the valid cell VC0.

Although one entry has been described in FIG. 5, when the number of entries is M+1 as shown in FIG. 3, since a plurality of valid cells (VC0 to VCm) are provided, the third word lines (VWL[0] to VWL[M]) are provided.

Modification

Hereinafter, some typical modifications of the embodiment will be described. In the following description of the modifications, the same reference characters as those in the above-described embodiment are used for the components having the same configuration and function as those described in the embodiment above. Further, as for the description of such components, the description in the embodiment above can be appropriately incorporated within a range that is not technically inconsistent. In addition, a part of the above-described embodiment and all or a part of the plurality of modifications can be applied in combination as appropriate within a range that is not technically inconsistent.

First Modification

Figure 7:
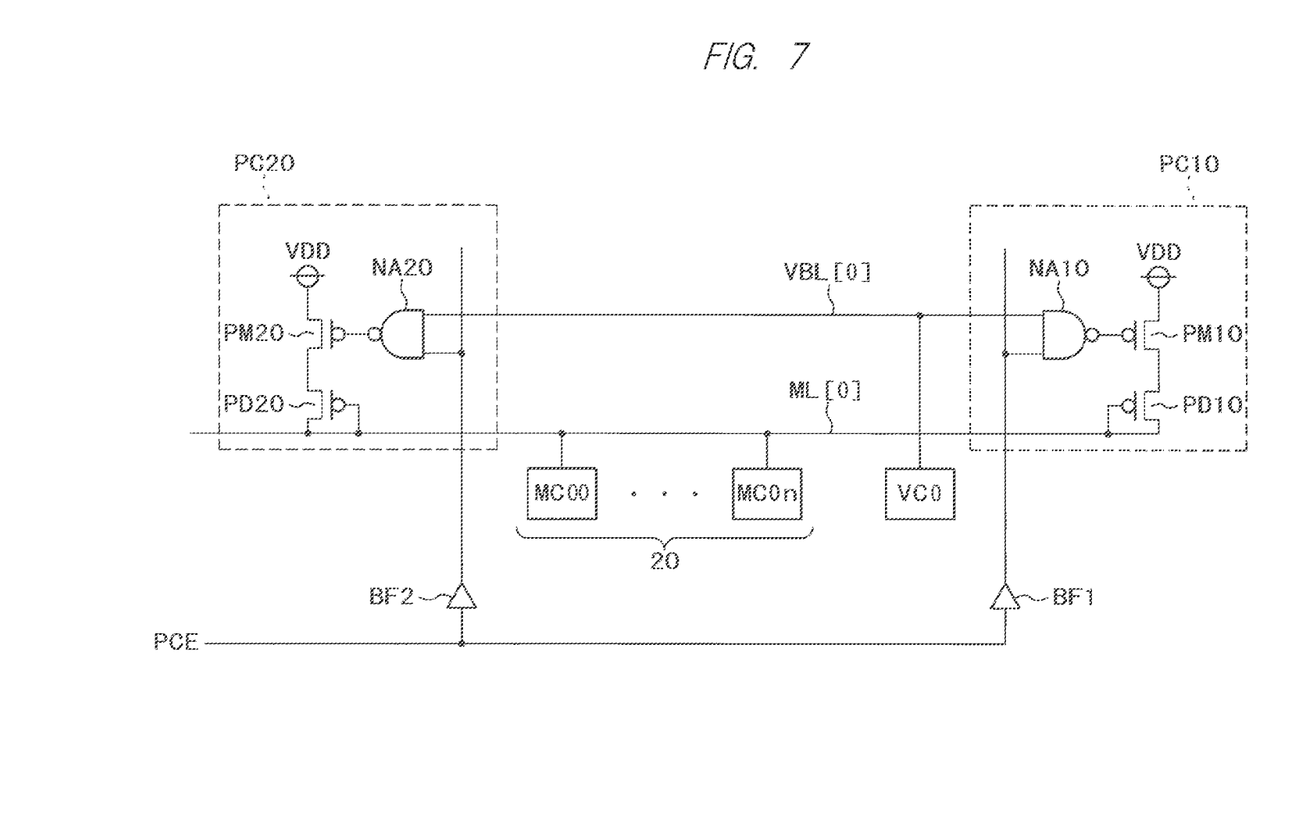
FIG. 7 is a diagram showing an example of a circuit configuration of a precharge circuit corresponding to one entry of the TCAM macrocell in the first modification.

The precharge circuit in the first modification will be described with reference to FIG. 7. FIG. 7 is a diagram showing an example of a circuit configuration of the precharge circuit corresponding to one entry of the TCAM macrocell in the first modification.

In the TCAM cell array, the capacity of the match line ML is large, and the EM problem becomes apparent when the wiring width becomes smaller due to miniaturization. Therefore, in the first modification, P-channel MOS transistors PD10 and PD20 that are diode-connected between the P-channel MOS transistors PM10 and PM20 and the match line ML [0] are provided. As a result, the current can be relaxed by lowering the precharge level of the match line ML[0].

Second Modification

Figure 8:
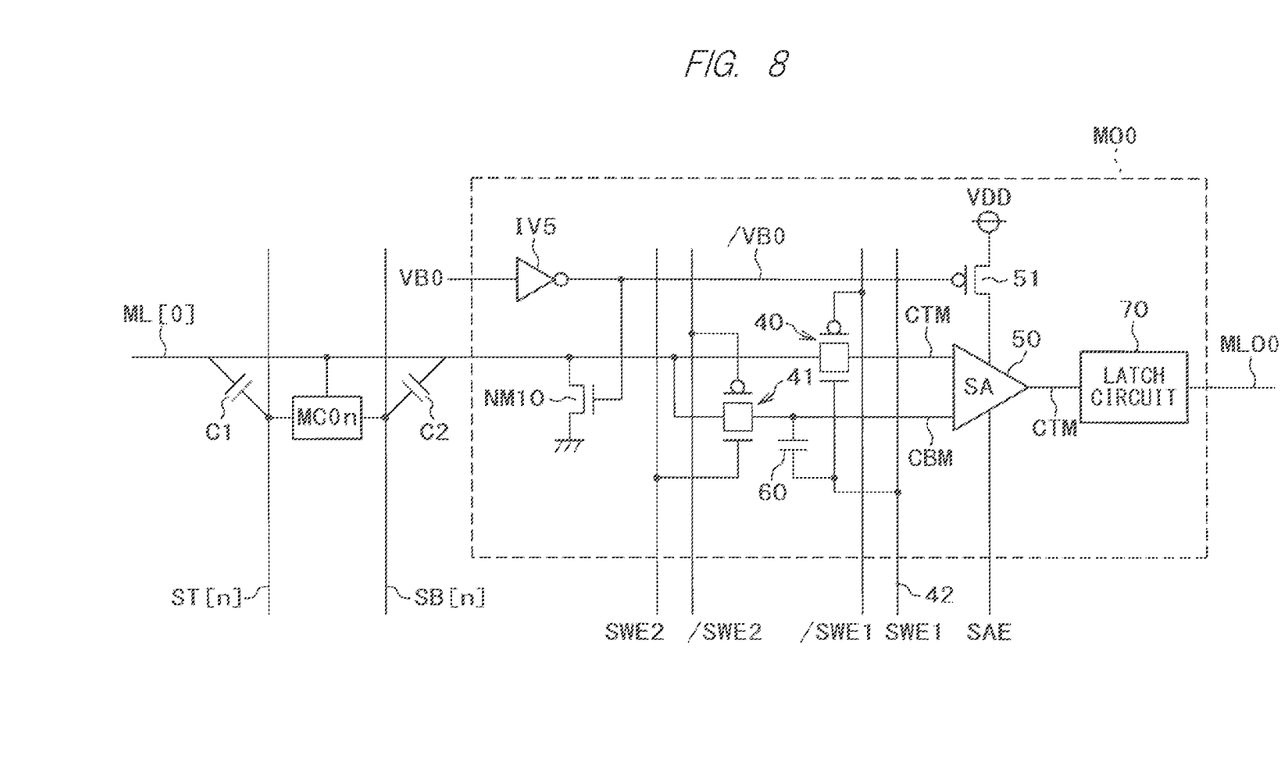
FIG. 8 is a diagram showing an example of a circuit configuration of a match line output circuit corresponding to one entry of the TCAM macrocell in the second modification.
Figure 9:
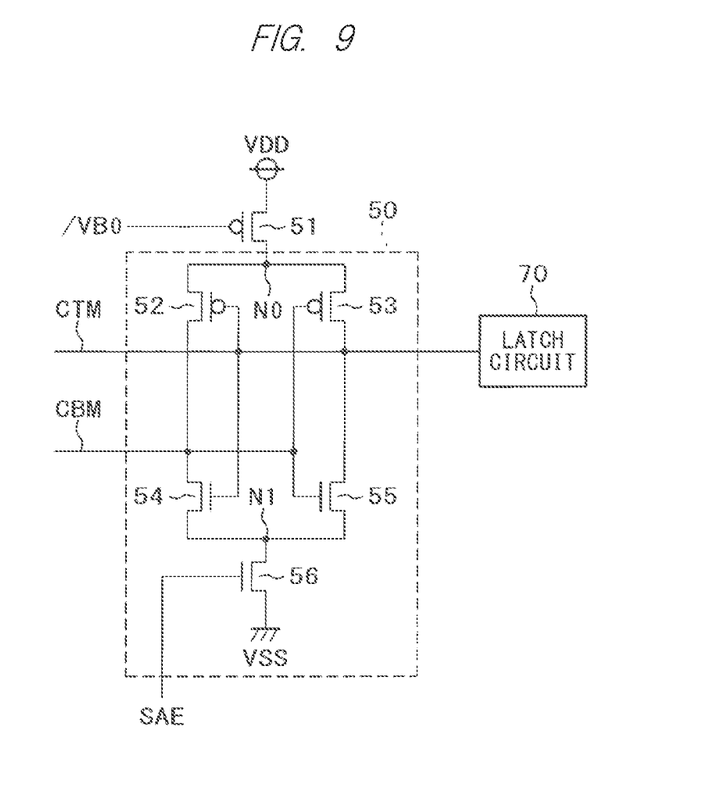
FIG. 9 is a diagram showing an example of a circuit configuration of a sense amplifier in FIG. 8.
Figure 10:
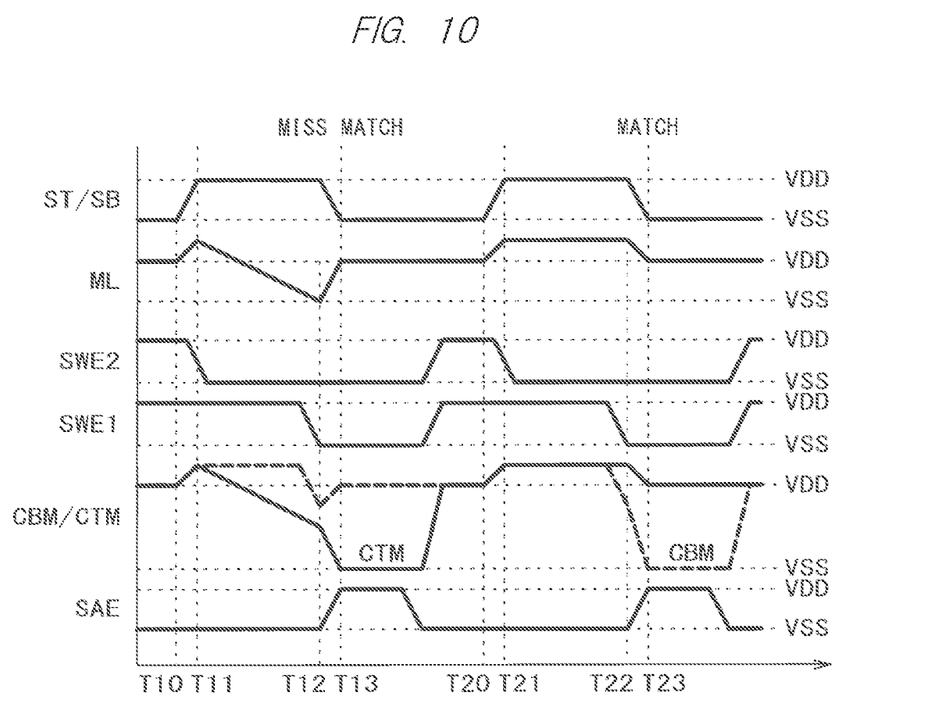
FIG. 10 is a timing chart diagram for describing an operation of the match line output circuit in the second modification.

The match line output circuit in the second modification will be described with reference to FIG. 8 to FIG. 10. FIG. 8 is a diagram showing an example of a circuit configuration of the match line output circuit corresponding to one entry of the TCAM macrocell in the second modification. FIG. 9 is a diagram showing an example of a circuit configuration of the sense amplifier in FIG. 8. FIG. 10 is a timing chart diagram for describing an operation of the match line output circuit in the second modification.

As shown in FIG. 8, the match line output circuit MO0 includes transfer gates 40 and 41, a sense amplifier 50, a power switch 51, a capacitor 60, and a latch circuit 70.

The transfer gate 40 is provided between the match line ML[0] and an input node CTM of the sense amplifier 50. The transfer gate 40 operates according to control signals SWE1 and /SWE1. The transfer gate 41 is provided between the match line ML[0] and an input node CBM. The transfer gate 41 operates according to control signals SWE2 and /SWE2. Here, the transfer gates 40 and 41 are configured by connecting a P-channel MOS transistor and an N-channel MOS transistor in parallel. The control signals SWE1 and SWE2 are connected to the gate of the N-channel MOS transistor, and the control signals /SWE1 and /SWE2 are connected to the gate of the P-channel MOS transistor.

When the control signals SWE1 and SWE2 are set to a low level and the control signals /SWE1 and /SWE2 are set to a high level, the transfer gates 40 and 41 are turned on. As a result, the match line ML[0] and the input nodes CTM and CBM are connected.

On the other hand, when the control signals SWE1 and SWE2 are set to a high level and the control signals /SWE1 and /SWE2 are set to a low level, the transfer gates 40 and 41 are turned off. As a result, the electrical connection between the match line ML and the input nodes CTM and CBM comes into or out of contact.

The sense amplifier 50 amplifies the potential difference between the input node CTM and the input node CBM and outputs the amplified signal to the latch circuit 70.

The latch circuit 70 latches the low level or high level signal amplified by the sense amplifier 50 and outputs it to the match signal output line MLO0. When the match signal output line MLO0 is at a high level, it indicates that the search data matches. On the other hand, when the match signal output line MLO0 is at a low level, it indicates that the search data mismatches.

The capacitor 60 is provided between the input node CBM and a signal wiring 42 to which the control signal SWE1 is input. One end side of the capacitor 60 is connected to the input node CBM, and the other end side is connected to the signal wiring 42 to which the control signal SWE1 is input. The capacitor 60 can adjust the potential of the input node CBM.

As shown in FIG. 9, the sense amplifier 50 includes P-channel MOS transistors 52 and 53 and N-channel MOS transistors 54 to 56.

The P-channel MOS transistor 52 is provided between a power supply node N0 and the input node CBM, and the gate thereof is connected to the input node CTM. The P-channel MOS transistor 53 is provided between the power supply node N0 and the input node CTM, and the gate thereof is connected to the input node CBM.

The N-channel MOS transistor 56 is provided between the ground potential VSS and a ground node N1, and the gate thereof receives the input of a control signal SAE. The N-channel MOS transistor 54 is provided between the ground node N1 and the input node CBM, and the gate thereof is connected to the input node CTM. The N-channel MOS transistor 55 is provided between the ground node N1 and the input node CTM, and the gate thereof is connected to the input node CBM.

The power switch 51 composed of a P-channel MOS transistor is provided between the power supply potential VDD and the power supply node N0, and the gate thereof receives an input of a control signal /VB0 which is an inverted signal of the valid bit VB0. The sense amplifier 50 is activated according to the control signals SAE and /VB0 being at a high level and a low level. The sense amplifier 50 is deactivated according to the control signals SAE and /VB0 being at a low level and a high level.

The case where the search data mismatches will be described with reference to FIG. 10.

Before the time T10, the potential of the match line ML[0] is precharged to a high level (power supply potential VDD level). Further, the control signals SWE1 and SWE2 are set to a high level, and the control signals /SWE1 and /SWE2 are set to a low level. Therefore, the transfer gates 40 and 41 are turned on, and the match line ML[0] is connected to the input nodes CTM and CBM.

At the time T10, the search is started and the search data is supplied to the search line pair ST and SB. When the search line pair ST and SB rises by the coupling capacitances C1 and C2 of the search line pair ST and SB, the entry data, and the match line ML[0], the potential of the match line ML[0] once increases and becomes higher than the power supply potential VDD. Since the search data mismatches, the potential of the match line ML[0] decreases at the time T11. Further, the control signal SWE1 is set to a high level, and the control signal /SWE1 is set to a low level. The control signal SW2 is set to a low level and the control signal /SWE2 is set to a high level. Therefore, the transfer gate 40 is turned on, and the match line ML[0] and the input node CTM are connected. Further, the transfer gate 40 is turned off and the input node CBM is set to an open state. Therefore, as the potential of the match line ML[0] decreases, the potential of the input node CTM of the sense amplifier 50 decreases. On the other hand, the potential of the input node CBM is maintained.

At the time T12, the control signal SWE1 is set to a low level and the control signal /SWE1 is set to a high level. Accordingly, the transfer gate 40 is turned off. Further, the potential of the other end of the capacitor 60 connected to the input node CBM is set to a low level. As a result, the potential of the input node CBM decreases to a predetermined potential level.

Next, at the time T13, the control signal SAE is set to a high level. Accordingly, the sense amplifier 50 is activated. As the sense amplifier 50 is activated, the potential difference between the input node CTM and the input node CBM is amplified, and the input node CTM is set to the ground potential VSS as the second potential and the input node CBM is set to the power supply potential VDD as the first potential.

Next, the case where the search data matches will be described with reference to FIG. 10.

Before the time T20, the potential of the match line ML[0] is precharged to a high level (power supply potential VDD level). Further, the control signals SWE1 and SWE2 are set to a high level, and the control signals /SWE1 and /SWE2 are set to a low level. Therefore, the transfer gates 40 and 41 are turned on, and the match line ML is connected to the input nodes CTM and CBM.

At the time T20, the search is started and the search data is supplied to the search line pair ST and SB. When the search line pair ST and SB rises by the coupling capacitances C1 and C2 of the search line pair ST and SB, the entry data, and the match line ML[0], the potential of the match line ML[0] once increases and becomes higher than the power supply potential VDD. Since the entry data and the search data match, the potential of the match line ML[0] is maintained. Further, the control signal SWE1 is set to a high level, and the control signal /SWE1 is set to a low level. The control signal SW2 is set to a low level and the control signal /SWE2 is set to a high level. Therefore, the transfer gate 40 is turned on, and the match line ML[0] and the input node CTM are connected. Further, the transfer gate 40 is turned off and the input node CBM is set to an open state. Therefore, as the potential of the match line ML[0] is maintained, the potential of the input nodes CTM and CBM of the sense amplifier 50 is set to the power supply potential VDD.

At the time T22, the control signal SWE1 is set to a low level and the control signal /SWE1 is set to a high level. Accordingly, the transfer gate 40 is turned off. Further, the potential of the other end of the capacitor 60 connected to the input node CBM is set to a low level. As a result, the potential of the input node CBM decreases to a predetermined potential level.

Next, at the time T23, the control signal SAE is set to a high level. Accordingly, the sense amplifier 50 is activated. As the sense amplifier 50 is activated, the potential difference between the input node CTM and the input node CBM is amplified, and the input node CTM is set to the power supply potential VDD and the input node CBM is set to the ground potential VSS.

The sense amplifier 50 according to the second modification asserts the search line pair ST and SB, and then generates the reference potential of the input node CBM to be compared from the match line ML. Therefore, it is possible to cope with even the case where the match line ML is moved by the coupling from the search line pair ST and SB or the precharge level is changed. Further, it is not necessary to provide a voltage generation circuit for generating a reference voltage to be compared, and the area can be reduced.

Note that the power supply potential VDD is supplied to the sense amplifier of the match line output circuit MO0 by the control signal /VB0 instead of the inverted signal of the control signal SAE. When the entry becomes invalid (VB0=0), the match line ML becomes a low level and the input node CTM becomes a low level. The input node CBM generated from it becomes a negative potential and the sense-up output becomes a high level, so that the match is output. In order to prevent this erroneous reading, the supply of the power supply potential VDD of the sense amplifier is stopped by the control signal /VB0.

Application Example

Figure 11:
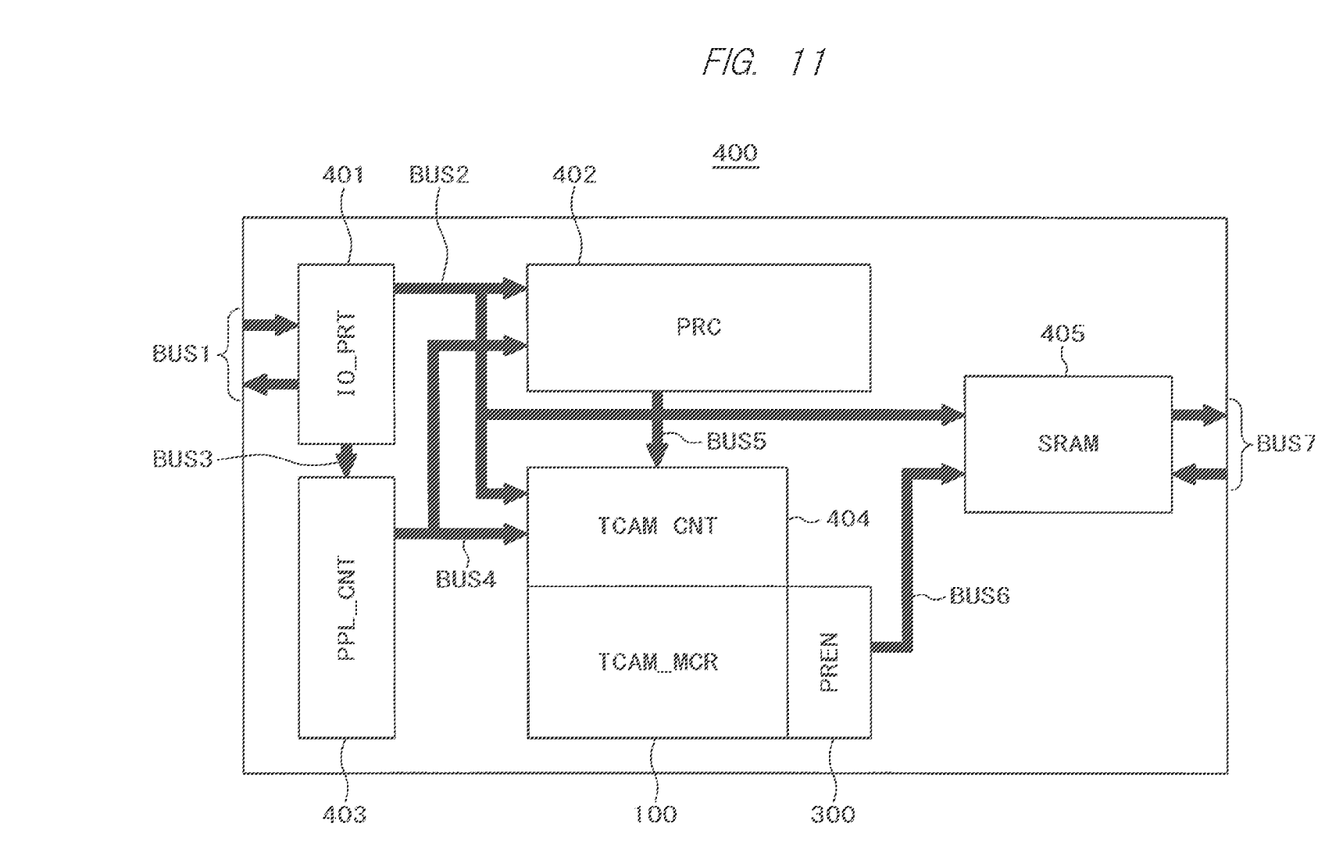
FIG. 11 is a block diagram of a semiconductor device in an application example.

FIG. 11 is a block diagram of a semiconductor device in an application example.

A semiconductor device 400 is formed on one semiconductor chip. The semiconductor device 400 has a function of, for example, a data processing device for network such as a packet router.

The semiconductor device 400 includes an input/output circuit (I/O_PRT) 401, a processor (PRC) 402, and a pipeline control circuit (PPL_CNT) 403. The semiconductor device 400 also includes a TCAM control circuit (TCAM_CNT) 404, a TCAM macrocell (TCAM_MCR) 100, a priority encoder (PREN) 300, and an SRAM 405 as a memory device. As the TCAM macrocell 100, any one of the configuration of the embodiment, the first modification, and the second modification or a combination thereof can be applied as appropriate.

The input/output circuit 401 is connected to the outside of the semiconductor device 400 through an input/output bus BUS1. The input/output circuit 401 is also connected to the processor 402, the TCAM control circuit 404, and the SRAM 405 through an internal bus BUS2. The input/output circuit 401 is also connected to the pipeline control circuit 403 through an internal bus BUS3. The pipeline control circuit 403 is connected to the processor 402 and the TCAM control circuit 404 through an internal bus BUS4, and controls the operation of the processor 402 and the TCAM control circuit 404. The processor 402 is connected to the TCAM control circuit 404 through an internal bus BUS5. Further, the priority encoder 300 is connected to the SRAM 405 through an internal bus BUS 6, and the SRAM 405 is connected to the outside of the semiconductor device 400 through an input/output bus BUS 7.

The TCAM control circuit 404 controls the operation of the TCAM macrocell 100, and instructs the TCAM macrocell 100 to store or update the entry and perform the search operation. The TCAM control circuit 404 stores a search key (search data) used for the search operation.

The priority encoder 300 takes in the search result of the TCAM macrocell 100 and outputs the search results to the SRAM 405 according to a predetermined priority order. The SRAM 405 is accessed by an address according to the search result from the priority encoder 300, and outputs the access result to, for example, the outside of the semiconductor device 400 through the input/output bus BUS7.

Although the disclosure made by the present disclosers has been specifically described above based on the embodiment and modifications, it goes without saying that this disclosure is not limited to the above-described embodiment and modifications and can be variously modified.

What is claimed is:

1. A semiconductor device comprising:
a match line;
a plurality of memory cells connected to the match line;
a word line connected to each of the plurality of memory cells;
a word line driver connected to the word line;
an output circuit connected to the match line;
a valid cell configured to store a valid bit indicating valid or invalid of an entry;
a first precharge circuit connected to one end of the match line and configured to precharge the match line to a high level based on a precharge control signal when the valid bit stored in the valid cell indicates valid; and
a second precharge circuit connected to the other end of the match line and configured to precharge the match line to a high level based on the precharge control signal when the valid bit stored in the valid cell indicates valid,
wherein the plurality of memory cells are arranged between the first precharge circuit and the second precharge circuit, and
wherein the second precharge circuit is arranged between the word line driver and the plurality of memory cells,
wherein the word line driver, the second precharge circuit, the plurality of memory cells, the valid cell, the first precharge circuit, and the output circuit are arranged in this order in a first direction,
wherein the semiconductor device further comprises a signal wiring to which the valid bit is transmitted,
wherein the signal wiring and the match line extend in the first direction between the first precharge circuit and the second precharge circuit, and
wherein each of the first precharge circuit and the second precharge circuit includes i) a first P-channel MOS transistor whose source-drain path is electrically connected between a power supply and the match line and ii) a second P-channel MOS transistor which is diode-connected between the first P-channel MOS transistor and the match line.

2. A semiconductor device comprising:
a plurality of search memory cells arranged in a matrix;
a plurality of match lines each provided so as to correspond to a memory cell row and configured to determine match/mismatch between data stored in the search memory cell and search data;
a plurality of valid information cells each provided so as to correspond to the memory cell row and configured to store information indicating whether the memory cell row is valid or not;
a plurality of first precharge circuits each provided so as to correspond to the memory cell row and configured to supply a first potential to one end of the match line;
a plurality of second precharge circuits each provided so as to correspond to the memory cell row and configured to supply the first potential to the other end of the match line; and
match line output circuits each provided so as to correspond to the memory cell row and connected to the match line,
wherein when the information stored in the corresponding valid information cell is valid, the first precharge circuit and the second precharge circuit precharge the corresponding match line to the first potential before data searching and set it to an open state at the data searching,
wherein the match line is electrically connected to a second potential lower than the first potential via the corresponding memory cell row of the search memory cells when the search data mismatches,
wherein the first precharge circuit and the second precharge circuit are operated in accordance with a precharge control signal, wherein the second precharge circuit, the search memory cell, the valid information cell, the first precharge circuit, and the match line output circuit are arranged in this order in a first direction, wherein the semiconductor device further comprises a plurality of signal wirings each of which is provided so as to corresponding to the memory cell row and to which the information is transmitted, wherein the signal wiring and the match line extend in the first direction between the first precharge circuit and the second precharge circuit, and wherein each of the first precharge circuit and the second precharge circuit includes i) a first P-channel MOS transistor having one end electrically connected to a first power supply potential and the other end electrically connected to the match line and ii) a second P-channel MOS transistor which is diode-connected between the other end of the first P-channel MOS transistor and the match line.

3. A semiconductor device comprising:

a plurality of search memory cells arranged in a matrix;

a plurality of match lines each provided so as to correspond to a memory cell row and configured to determine match/mismatch between data stored in the search memory cell and search data;

a plurality of valid information cells each provided so as to correspond to the memory cell row and configured to store information indicating whether the memory cell row is valid or not;

a plurality of first precharge circuits each provided so as to correspond to the memory cell row and configured to supply a first potential to one end of the match line;

a plurality of second precharge circuits each provided so as to correspond to the memory cell row and configured to supply the first potential to the other end of the match line; and match line output circuits each provided so as to correspond to the memory cell row and connected to the match line, wherein when the information stored in the corresponding valid information cell is valid, the first precharge circuit and the second precharge circuit precharge the corresponding match line to the first potential before data searching and set it to an open state at the data searching, wherein the match line output circuit includes a differential sense amplifier, wherein the differential sense amplifier outputs a signal obtained by amplifying a potential difference based on a comparison between a potential of a corresponding match line and a reference potential to be compared, wherein the differential sense amplifier has an input node to which the potential of the corresponding match line is input and an input reference node to which the reference potential to be compared is input, and wherein the semiconductor device further comprises:
  a capacitor having one end connected to the input reference node; and
  a first control signal wiring connected to the other end of the capacitor.

4. The semiconductor device according to claim 3, further comprising:
  a first switch configured to electrically connect the match line and the input node in accordance with a first control instruction of the first control signal wiring; and
  s second switch configured to electrically connect the match line and the input reference node in accordance with a second control instruction.

5. The semiconductor device according to claim 4, wherein the first control instruction and the second control instruction have different input timings.

6. The semiconductor device according to claim 2, further comprising a match signal output line connected to the match line output circuit,
  wherein the match line output circuit outputs a high level or a low level of the match line to the match signal output line when the information stored in the corresponding valid information cell indicates valid, and
  wherein the match line output circuit sets the match signal output line to a low level when the information stored in the corresponding valid information cell indicates invalid.

* * * * *